United States Patent [19]

Lee

[11] 4,236,070
[45] Nov. 25, 1980

[54] SHAFT POSITION ENCODER

[76] Inventor: Herbert S. Lee, 7041 Mariner Way, Long Beach, Calif. 90803

[21] Appl. No.: 875,167

[22] Filed: Feb. 6, 1978

[51] Int. Cl.$^2$ .............................................. G01D 5/34
[52] U.S. Cl. .............................. 250/231 SE; 250/227
[58] Field of Search ................. 250/231 SE, 229, 227; 340/347 P, 365 P, 190, 201 P

[56] References Cited

U.S. PATENT DOCUMENTS

| 3,731,107 | 5/1973 | Goodwin et al. | 250/231 SE |
| 4,013,342 | 3/1977 | Narodny | 250/229 X |

Primary Examiner—David C. Nelms
Assistant Examiner—Darwin R. Hostetter

[57] ABSTRACT

A new type of optoelectronic encoder conformed in one embodiment as a translucent cylinder having a reflective opaque coating on the lateral and end surfaces thereof, the cylindrical segment being further broken down into a set of lateral strips separated by a plurality of peripheral grooves. Portions of the reflective opaque coating are then removed, and the surface polished over selected areas of each strip to produce the desired light apertures. A first end of this cylinder has the opaque coating removed and is then polished to receive light. A second end is secured to a selected rotary shaft for measurement and selection of position of the latter, and is in effect an extension of the shaft. A bank of conventional phototransistors is then deployed over the cylinder, each respective phototransistor being exited by a light ray from the aperture associated therewith in the subjacent strip of the cylinder, thus indicating the position of the selected shaft. In a similar manner the other embodiment of the invention utilizes a plurality of optical fibers arranged in a longitudinal group in a cylindrical casting, each fiber being turned proximate one another to assume a radial position at a predetermined station of the cylindrical casting. Disposed in alignment with these cylinder stations are, once more, a plurality of conventional phototransistors, which when intermittently illuminated by rays of light from the fiber ends indicate specific shaft positions. In both embodiments the light source is provided by way of a light emitting diode or a laser beam shining directly into the polished end of the cylinder, the fibers in the second embodiment acting as wave guides to direct the light to the radially directed fiber ends.

5 Claims, 5 Drawing Figures

SHAFT POSITION ENCODER

BACKGROUND OF THE INVENTION

1. Field of the Invention

The present invention relates to shaft position indicating systems, and more particularly to an opto-electronic shaft encoder conformed for inline mounting with a selected rotary shaft.

2. Description of the Prior Art

Shaft encoders utilizing photoelectric coupling have been known in the past. Most frequently as resolution and accuracy increases are desired, the radial size of these prior art encoders increases. This trade-off of accuracy against radial dimension has a compounding effect by increasing moment of inertia, which in the case of high speed devices may turn out to be prohibitive. Alternately, the radial clearance around a measured shaft is often insufficient to accommodate such prior art encoders, again precluding full utilization thereof. In addition, most of the prior art encoders are tightly packed with coating apertures, thus precluding convenient manual inscription of a specifically desired code. This tight packing further complicates sensor spacing both in dynamic systems use and in the convenience of assembly.

SUMMARY OF THE INVENTION

Accordingly, it is the general purpose and object of the present invention to provide a cylindrical shaft encoder and which by expansion of its length can be expanded in resolution and accuracy.

Further objects of the invention are to provide a cylindrical shaft encoder which introduces minimal additional inertia to a measured rotary shaft.

Yet additional objects of the invention are to produce a shaft encoder which can be specifically coded for any desired use.

Yet additional objects of the invention are to produce a shaft encoder which is simple to produce, convenient in use, and entails minimal alignment problems.

Briefly, these and other objects are accomplished within the present invention by conforming an encoder in a manner of a cylindrical segment, the cylindrical segment including either a plurality of fiber optic strands embedded therein or comprising a translucent structure. In the first instance, the fiber optic strands are aligned as a group longitudinal within the segment, selected ones thereof being turned at various longitudinal stations of the cylinder to expose the second end surfaces thereof on the cylinder surface. The first ends of the fibers are exposed in common at the end surface of the segment to be illuminated by a light source such as a light emitting diode or laser. In this form, rotation of the cylindrical segment advances the various radially aligned fiber ends into the field of reception of phototransistors arranged as a longitudinal bank, sequentially rendering each corresponding transistor conductive to indicate a particular angular position of the shaft or may be used with an electronic system for binary counting.

The foregoing arrangement of parts can be adapted for special coding by the structure of an alternative cylinder segment. More specifically, the alternative embodiment entails the use of a translucent cylindrical segment which around the periphery thereof is grooved to provide a plurality of peripheral strips, the strips and grooves being coated with a reflective opaque coating. The grooves are formed to provide maximum reflection of light within the cylinder. The segment is ground at one end and exposed to a light source and the peripheral strips are variously polished off to provide selectively located apertures into the translucent interior of the light carrier. The selective coding of each strip allows for any desired coding sequence which once more are detected by way of a bank of phototransistors.

In each instance the inventive structure herein utilizes the length of the shaft rather than radius to increase coding resolution. It is to be noted that various logic devices triggered at the leading and trailing edge of each light aperture can be utilized, thus permitting relatively high accuracy with simple manual technique.

DESCRIPTION OF THE SPECIFIC EMBODIMENT

While the following description sets forth several implementations of a shaft encoder assembly, these examples are illustrative only. It is to be understood that various other alternatives may be utilized according to the principles set forth herein and no intent to limit the scope of the invention by way of these examples is expressed.

Figure 1:
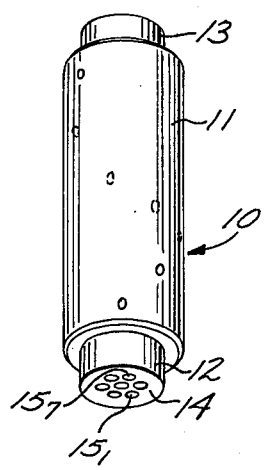
FIG. 1 is a perspective illustration of a first embodiment of an encoding cylinder useful with the invention herein containing optical fibers.
Figure 4:
FIG. 4 is a sectional view of a shaft encoder assembly illustrating the use of the first coding cylinder therein.

The first form A of the invention as shown in FIG. 4, includes a coding cylinder 10 that has an external surface 11 and bearing journals 12 and 13, respectively of reduced diameter. Journal 12 at the free end thereof is ground and polished to a smooth end surface 14, exposing the first ends of a plurality of optical fibers $15_1$ through $15_7$ embedded as a longitudinal group on the interior of the coding cylinder 10. The fibers $15_1$ through $15_7$ at predetermined stations of cylinder 10 extend outwardly radially relative to the cylinder to terminate at surface 11, the second ends of the fibers $15_1$ through $15_7$ thus being exposed at the peripheral surface 11. To illustrate this longitudinal spacing the disposition of the optical fibers $15_1$ through $15_7$, shown in FIG. 4, is illustrated in a common plane. It is to be understood that the second end of each fiber is aligned along a radial arc corresponding to the increment of rotation to be measured thereby, as shown in FIG. 1.

Optical fibers $15_1$ through $15_7$ are cast integrally with the casting of cylinder 10, the material structure of the cylinder being opaque or having a sufficient refractive index to limit each optical fiber to the function of a wave guide for communicating light therethrough.

Cylinder 10 is mounted for rotation by way of the end journals 12 and 13 in a support frame B comprising two end bearing assemblies 21 and 22 attached to an elongate rigid member 43 provided with a plurality of transverse bores 44, each bore receiving corresponding phototransistors $25_1$ through $25_7$. Bearing assemblies 21 and 22 are secured to member 43 by screws 43a, with the bearing assemblies resting on a base 47 to which they are secured by conventional means. In the embodiments herein phototransistors $25_1$ through $25_7$ may be any conventional electronic devices and phototransistors of appropriate gain are adequate for the use herein. Transistors $25_1$ through $25_7$ furthermore are deployed in a common plane parallel to the axis of rotation of cylinder 10 at stations aligned to register the light passed through the radially directed ends of fibers $15_1$ through $15_7$.

To provide for the necessary rotary engagement bearing assemblies 21 and 22, each include a corresponding bore 23 and 24, bore 23 being conformed to receive journal 12, with bore 24 being conformed to receive journal 13. Bore 24 furthermore is reduced across a shoulder 25 to provide a shaft opening 27. Similarly the other support, i.e., the bore 23 reduces to a smaller diameter opening 26 conformed to receive a light emitting diode 28 which is thus exposed to transmit light to the ground end surface 14 and therefore to first ends of fibers $15_1$ through $15_7$ that are flush therewith.

A rotatable connector 31 and the opposing surface of journal 13 are provided with key slots 32 and 33 respectively, for receiving a rectangular key 34 therein. Alternatively, connector 31 may be bonded to the free end of journal 13 (not shown). Connector 31 terminates in a chuck assembly 35 provided with a central recess 36 conformed to receive rotary output shafts C of various diameters that are to be monitored by the invention A. The end portion of a shaft C is centered in recess 36 and is frictionally engaged by a number of circumferentially spaced screws 37 that extend through radially disposed tapped bores 35a formed in the chuck assembly. Similarly the other support, i.e., the bore 23 reduces to a smaller diameter opening 26 conformed to receive a light-emitting diode 28 which is thus exposed to transmit light to the ground end surface 14 and therefore to the common exposed first ends of fibers $15_1$ through $15_7$.

By virtue of this arrangement, the light emitting diode 28 produces the light which is then communicated by the fibers to points exposed on the lateral exterior of cylinder 11. These fiber ends as they are advanced in rotation illuminate the corresponding ones of the phototransistors $25_1$ through $25_7$, thus indicating the angular position of the shaft C.

Figure 2:
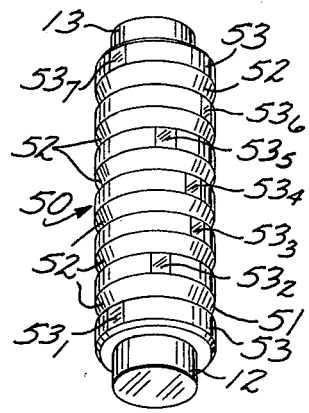
FIG. 2 is yet another perspective illustration of a second embodiment of a coding cylinder constructed according to the present invention.
Figure 3:
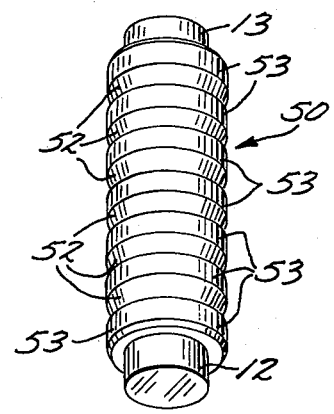
FIG. 3 is a perspective illustration of the coding cylinder shown in FIG. 2 prior to the light apertures formed therein.
Figure 5:
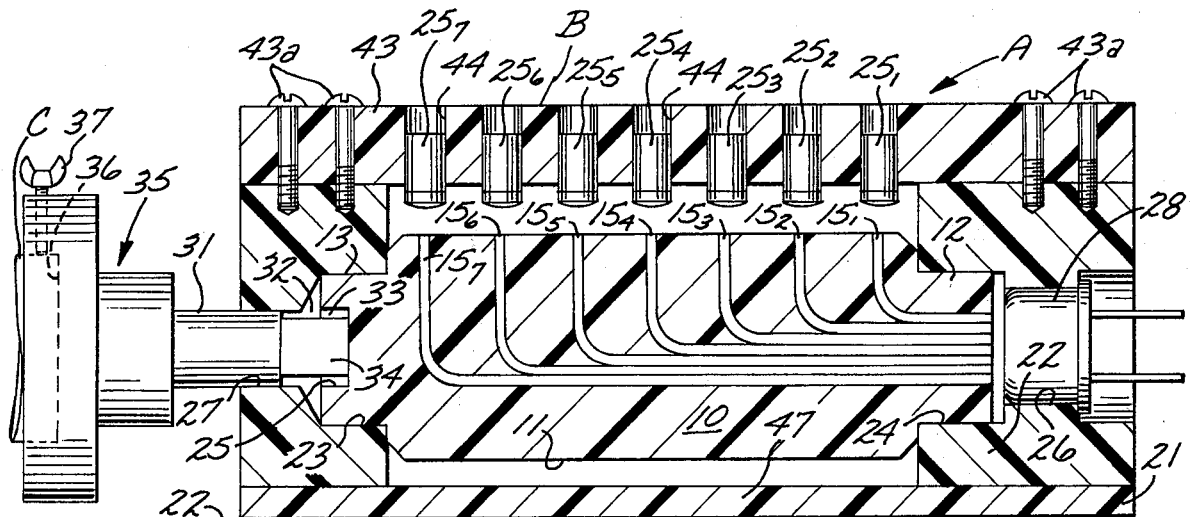
FIG. 5 is yet another sectional view of a shaft encoder assembly utilizing the second coding cylinder therein.
Figure 5:
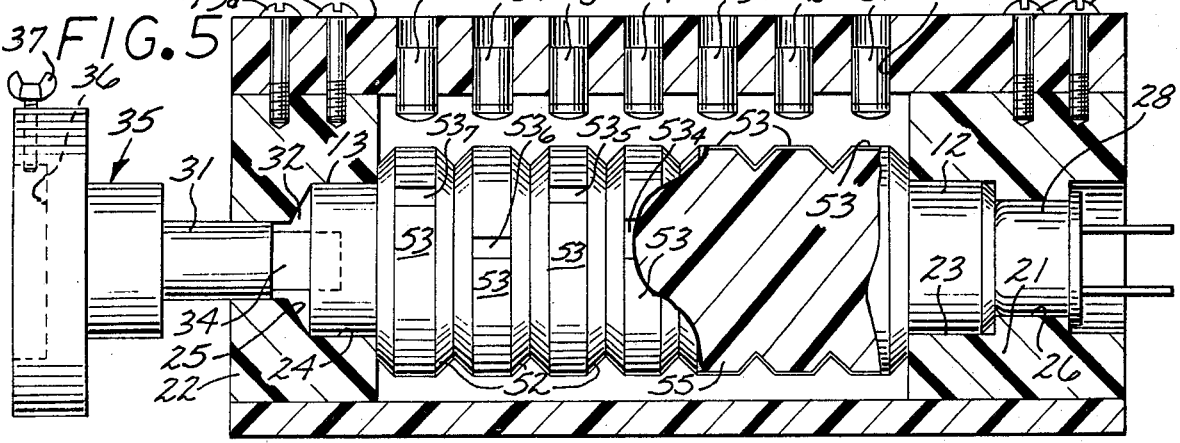

By way of a similar arrangement an alternative embodiment shown in FIGS. 2, 3 and 5 is implemented. More specifically the same carrier structure is utilized for this implementation and for that reason the same numerals are followed to describe the quotation thereof, the variation being in the cylinder itself. More specifically as shown in FIG. 2 an alternative cylinder generally designated by the numeral 50 includes a cylindrical segment 51 provided with a plurality of peripheral grooves 52 separating the exterior lateral surface thereof into a plurality of ring-shaped strips. The angles of the grooves or any like deformation of the cylinder is arranged to provide maximum reflection of light to the strips. It is intended to form cylinder 50 out of a translucent light carrying material, cylinder 50 once more including the end journals 12 and 13, journal 12 terminating in a free end surface 14 again polished and ground for light transmission. Deposited on the exterior of cylinder 50 is an internally reflective opaque coating or layer 53 which may be of a flective material like silver or aluminum coating which can be selectively stripped away and polished at desired positions to provide the necessary light transmission apertures $53_1$ through $53_7$. In FIG. 2 this aperture arrangement is shown as a spiral alignment of apertures $53_1$ through $53_7$ corresponding to the function of fibers $15_1$ through $15_7$. This provision of apertures $53_1$ through $53_7$ may be made in any convenient manner, by way of a sharp cutting tool or other conventional device for removing the outer coating for any desired selective manual coding. Should it be desired the apertures $53_1$ through $53_7$ may be arranged to provide a binary code or similar other parallel coding scheme.

It is to be understood that the foregoing second embodiment allows for extensive convenience in use, the exposed apertures being easily recoated by brush depositing technique. This latter feature is of particular significance in allowing the use of the device in laboratory or experimental applications, where, for example, the highest density strip may be left precoded while the other strips are coded to achieve the highest code efficiency.

In each instance the connection of the encoder to the measured shaft entails minimal connecting structure variously achieved, the minimal weight and inertia of the cylinder imposing minimal connection loads. Alternatively the cylinder may be joined to a hand knob assembly for manual shaft imputs which concurrently are converted to hold readout.

Obviously many modifications and variations to the above disclosure can be made without departing from the spirit of the invention. It is therefore intended that the scope of the invention be determined solely on the claims appended hereto.

What is claimed is:

1. An optoelectronic shaft position encoder, comprising:
    a support frame including an elongate spine member provided with a plurality of transverse bores attached to a coaxial first and second bearing assembly proximate the ends thereof, said transverse bores being directed towards the central axis of said first and second bearing assembly;
    a plurality of phototransducers each received in corresponding one of said transverse bores;
    a light source mounted in said first bearing assembly and aligned for directing light towards said second bearing assembly; and
    an encoding cylinder mounted for rotation in said first and second bearing assemblies including a light receiving end proximate said light source and a plurality of light emitting apertures at the peripheral surface thereof, said apertures being deployed at selected radial positions of said cylinder in subjacent axial alignment relative said bores.

2. Apparatus according to claim 1 further comprising:
    shaft engaging means received in said second bearing assembly for advancing said cylinder in rotation.

3. Apparatus according to claim 2 wherein:
    said encoding cylinder is translucent and includes a plurality of peripheral grooves that define peripheral strips therebetween, each of said strips aligned subjacent a corresponding one of said transducers, and said encoding cylinder further including an exterior reflective opaque coating that extends partially over said strips, and the parts of said opaque coating not covering said strips constituting said light emitting apertures.

4. Apparatus according to claim 3 wherein: said light source comprises a light emitting diode, and said transducers each comprise a phototransistor.

5. Apparatus according to claim 2 which in addition includes:

a plurality of optical fibers embedded in said encoding cylinder that cooperate to define said light apertures, said optical fibers including first longitudinally extending portions that vary in length and have first and seconds ends, said first ends flush with said light receiving end of said encoding cylinder, and second portions of said optical fibers that are in light communication with said second end of said first portions, said second portions radially disposed in said encoding cylinder and longitudinally and circumferentially spaced from one another, said second portions including first ends flush with the exterior surface of said encoding cylinder, and said flush first ends providing said light emitting apertures.

* * * * *